(12) United States Patent
Hur

(10) Patent No.: US 7,573,724 B2
(45) Date of Patent: Aug. 11, 2009

(54) MEMORY MODULE AND CONNECTION INTERFACE BETWEEN THE MEMORY MODULE AND CIRCUIT BOARD

(75) Inventor: Soon-Yong Hur, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 428 days.

(21) Appl. No.: 11/146,000

(22) Filed: Jun. 7, 2005

(65) Prior Publication Data

US 2006/0133058 A1 Jun. 22, 2006

(30) Foreign Application Priority Data

Dec. 22, 2004 (KR) ............... 10-2004-0110355

(51) Int. Cl.
*H01R 12/16* (2006.01)
(52) U.S. Cl. ............... 361/785; 361/686; 361/756
(58) Field of Classification Search ............... 361/686, 361/684, 785, 756, 727, 737; 439/637, 64, 439/669, 377
See application file for complete search history.

(56) References Cited

U.S. PATENT DOCUMENTS

| | | | | |
|---|---|---|---|---|
| 3,614,541 A | * | 10/1971 | Farrand ............... | 361/730 |
| 4,689,721 A | * | 8/1987 | Damerow et al. ............ | 361/707 |
| 4,794,243 A | * | 12/1988 | Hamada ............... | 235/492 |
| 4,962,415 A | * | 10/1990 | Yamamoto et al. ............ | 257/679 |
| 5,181,855 A | * | 1/1993 | Mosquera et al. ............ | 439/74 |
| 5,500,789 A | * | 3/1996 | Miller et al. ............ | 361/816 |
| 5,564,933 A | * | 10/1996 | Bouchan et al. ............ | 439/76.1 |
| 6,144,561 A | * | 11/2000 | Cannella et al. ............ | 361/796 |
| 6,253,266 B1 | * | 6/2001 | Ohanian ............... | 710/301 |
| 6,538,331 B2 | * | 3/2003 | Masuda et al. ............ | 257/777 |
| 6,552,423 B2 | * | 4/2003 | Song et al. ............ | 257/679 |
| 6,859,369 B2 | * | 2/2005 | Mambakkam et al. ...... | 361/737 |
| 2001/0015485 A1 | * | 8/2001 | Song et al. ............ | 257/679 |
| 2003/0067064 A1 | * | 4/2003 | Kim ............... | 257/686 |
| 2003/0235040 A1 | * | 12/2003 | Liu et al. ............ | 361/737 |

FOREIGN PATENT DOCUMENTS

| | | |
|---|---|---|
| JP | 10-335580 | 12/1998 |
| JP | 2003-133518 | 5/2003 |
| KR | 10-2001-0038948 | 5/2001 |

* cited by examiner

*Primary Examiner*—Hung S Bui
(74) *Attorney, Agent, or Firm*—Harness, Dickey & Pierce

(57) ABSTRACT

A motherboard may have contact pads arranged along a peripheral region on one or both surfaces thereof. A memory module may have unit packages fixed to an upper plate and a lower plate of a module frame. The unit packages may be spaced apart from each other. The upper and the lower unit packages may have contact terminals facing each other. The contact terminals may be elastically bendable, and/or the unit packages may be mounted on the plates via elastic members. The peripheral region of the motherboard may be inserted into the memory module, so the contact terminals of the memory module may elastically contact with and be electrically coupled to the contact pads of the motherboard.

5 Claims, 5 Drawing Sheets

MEMORY MODULE AND CONNECTION INTERFACE BETWEEN THE MEMORY MODULE AND CIRCUIT BOARD

PRIORITY STATEMENT

This U.S. non-provisional application claims priority under 35 U.S.C. §119 from Korean Patent Application No. 2004-110355, which was filed in the Korean Intellectual Property Office on Dec. 22, 2004, the entire contents of which are incorporated herein by reference.

BACKGROUND

1. Field of the Invention

The present invention relates in general to a memory module and a connection interface between the memory module and a circuit board (for example, a motherboard).

2. Description of the Related Art

Semiconductor memory technology may achieve memory densities and speeds on the order of several Gbits and several GHz, respectively. According to conventional wisdom, a memory module may be provided by mounting a number of memory chips, in the form of packages (for example), on one or both sides of a printed circuit board. The memory modules may be inserted into respective sockets provided on circuit board (for example, a motherboard).

Although the conventional connection interface (i.e., memory modules inserted into sockets of the motherboard) are generally thought to be acceptable, they are not without shortcomings. For example, the sockets (for receiving the memory modules) may occupy a significant amount of space on the motherboard, thus causing an increase in size. Also, a stub-bus channel interface may restrict memory speed.

SUMMARY

Example, non-limiting embodiments of the present invention may provide a new connection interface between a memory module and a motherboard, and a new structure of the memory module suitable for the connection interface.

According to an example, non-limiting embodiment of the present invention, the memory module may include a module frame and a unit package. The module frame may have an inner space. The unit package may be mounted on the module frame and located in the inner space, thus defining a receiving space in the inner space. The unit package may have a plurality of contact terminals with distal ends in the receiving space.

According to another example, non-limiting embodiment of the present invention, the memory module may include a module frame, an upper unit package, and a lower unit package. The module frame may have an upper part, a lower part, and an inner space defined by the upper and the lower parts. The upper unit package may be mounted on the upper part and located in the inner space. The upper unit package may have a plurality of first contact terminals. The lower unit package may be mounted on the lower part and located in the inner space. The lower unit package may have a plurality of second contact terminals. The upper and the lower unit packages may be spaced apart from each other, defining a receiving space in the inner space. The first and the second contact terminals may have distal ends in the receiving space.

According to another example, non-limiting embodiment of the present invention, a connection interface may include a motherboard and a memory module. The motherboard may include an upper surface, a lower surface opposing the upper surface. A plurality of first contact pads may be arranged along a peripheral region of the upper surface. The memory module may include a module frame and an upper unit package. The module frame may have an upper plate facing the upper surface, a lower plate facing the lower surface, and a side plate. The upper and lower plates may be substantially parallel to and spaced apart from each other. The side plate may connect the upper and lower plates together. The upper, the lower and the side plates may define an inner space of the module frame. The upper unit package may be mounted on the upper plate and located in the inner space. The upper unit package may have a plurality of first contact terminals. The upper unit package and the lower plate may define a receiving space in the inner space. The peripheral region of the motherboard may be located in the receiving space. The first contact terminals of the memory module may be in contact with and electrically coupled to the first contact pads of the motherboard.

DETAILED DESCRIPTION OF EXAMPLE EMBODIMENTS

Figure 1:
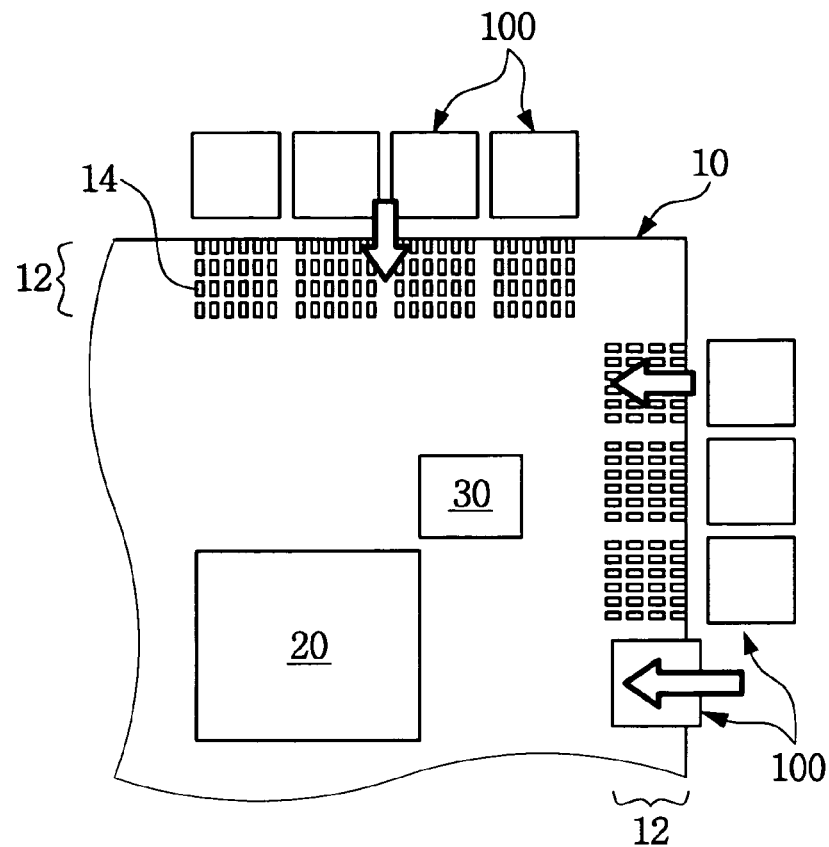
FIG. 1 is a schematic plan view of a connection interface between a memory module and a motherboard in accordance with an example, non-limiting embodiment of the present invention.

Example, non-limiting embodiments of the present invention will now be described more fully hereinafter with reference to the accompanying drawings. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

Well-known structures and processes are not described or illustrated in detail to avoid obscuring the present invention.

The figures are provided for illustrative purposes only and are not drawn to scale. For simplicity and clarity of illustration, the dimensions of some of the elements may be exaggerated relative to other elements. The figures, therefore, should not be interpreted as accurately reflecting the relative sizing or positioning of the corresponding structural elements that could be encompassed by an actual device manufactured according to the example embodiments of the invention. Like reference numerals are used for like and corresponding parts of the various drawings. An element is considered as being mounted (or provided) "on" another element when mounted (or provided) either directly on the referenced element or mounted (or provided) on other elements overlaying the referenced element.

Throughout this disclosure, the terms "upper," "lower" and "side" are used for convenience in describing various elements or portions or regions of the elements as shown in the figures. These terms do not, however, require that the structure be maintained in any particular orientation.

FIG. 1 shows, in a schematic plan view, a connection interface between a memory module 100 and a motherboard 10 in accordance with an example embodiment of the present invention. In alternative embodiments, the memory module 100 may be suitably connected to circuit boards other than a motherboard.

The motherboard 10, also referred to as a main board, may be the physical arrangement in a computer that contains the computer's basic circuitry and components. As is well known in the art, the computer components mounted on the motherboard 10 may include a central processing unit (CPU) 20 and a data controller chip 30. It will be appreciated that the motherboard 10 may have circuitry and additional components that are not depicted in FIG. 1 for simplicity and clarity of illustration.

The motherboard 10 may have major surfaces supporting contact pads 14. By way of example only, the contact pads 14 may be arranged along a peripheral region 12 of the motherboard 10. Also, the contact pads 14 may be located near the data controller chip 30, so as to reduce a length of electrical paths between the contact pads 14 and the data controller chip 30. It will be readily apparent to those skilled in the art that the contact pads 14 may be provided at numerous an alternative locations on the motherboard 10.

The memory module 100 may be physically and electrically connected to the motherboard 10. The memory module 100 may have a plurality of contact terminals for providing electrical connections to the contact pads 14 of the motherboard 10.

Figure 2A:
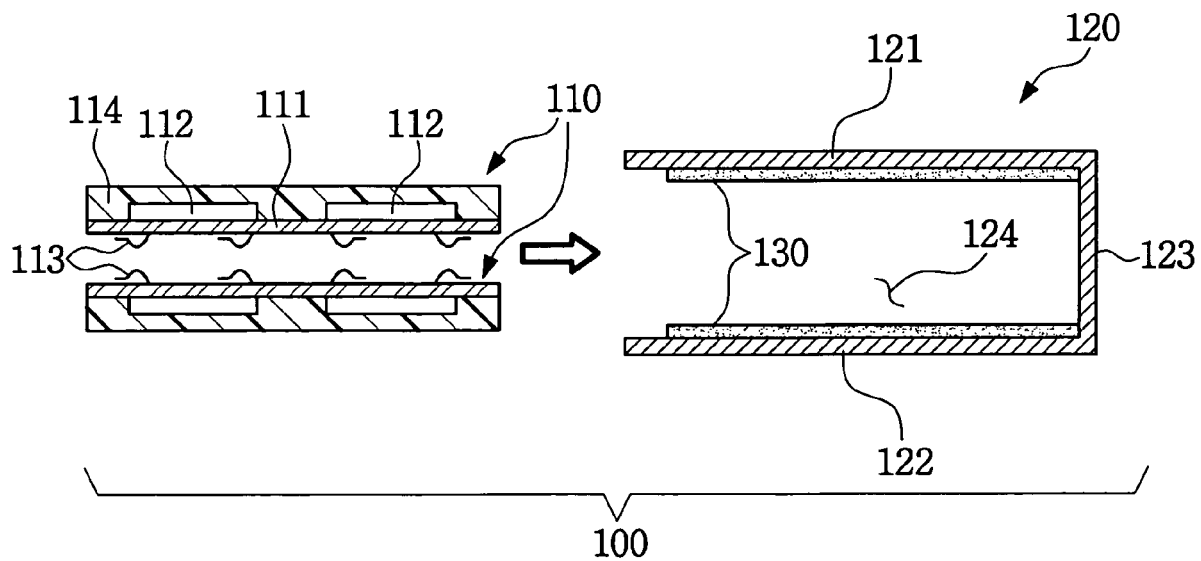
FIG. 2A is a cross-sectional view of a memory module, before assembly, in accordance with an example, non-limiting embodiment of the present invention.

FIG. 2A is a cross-sectional view of an example memory module 100 before assembly. As shown in FIG. 2A, the memory module 100 may include two unit packages 110 and a module frame 120.

Each unit package 110 may include a circuit substrate 111. At least one memory chip 112 may be mounted on a first surface of the circuit substrate 111. A plurality of contact terminals 113 may be provided on a second surface of the circuit substrate 111. The unit package 110 may have a package body 114 provided on the first surface of the circuit substrate 111. The package body may cover and/or protect the memory chip 112. Each contact terminal 113 may be an elongated metal lead that extends from the second surface of the circuit substrate 111. The contact terminal 113 may be shaped to extend laterally.

The module frame 120 may include plates. In this example embodiment, the module frame 120 may include three plates 121, 122 and 123, which will be referred to as an upper, a lower, and a side plate, respectively. In alternative embodiments, the module frame 120 may include more or less than three plates. As shown, the plates 121, 122 and 123 may have a flat shape. In alternative embodiments, the plates may have numerous and alternative shapes that will be readily apparent to those skilled in the art. For example, the plates may be of non-uniform thicknesses, have recesses, grooves, protrusions, holes, and/or other structures may extend from the plates. Further, the plates of a particular module frame may have different shapes.

By way of example only, the upper and the lower plates 121 and 122 may be substantially parallel to and spaced apart from each other. The side plate 123 may connect the upper and the lower plates 121 and 122 together. The plates 121, 122 and 123 may define an inner space 124. The plates 121, 122 and 123 may be fabricated from materials such as (for example) metal, reinforced plastic, and/or other alternative materials that are well known in this art. The plates 121, 122 and 123 may be separately fabricated and then assembled together, or alternatively, may be formed by bending one plate into a desired shape.

In this example embodiment, two unit packages 110 may be inserted into the inner space 124 of the module frame 120. The unit packages 110 may be fixed to the upper and the lower plates 121 and 122, respectively, by a fixing member 130. The fixing member 130 may be, for example, an adhesive material, which is applied to inward facing surfaces of the plates 121 and 122 and/or to outward facing surfaces of the package bodies 114 of the respective unit package 110. In alternative embodiments, other fixing member may be suitably implemented (instead of or in addition to the adhesive material). For example, the fixing member may be in the form of screws, nails, staples, pins, clips, and/or numerous other mechanical fasteners that are well known in this art.

Figure 2B:
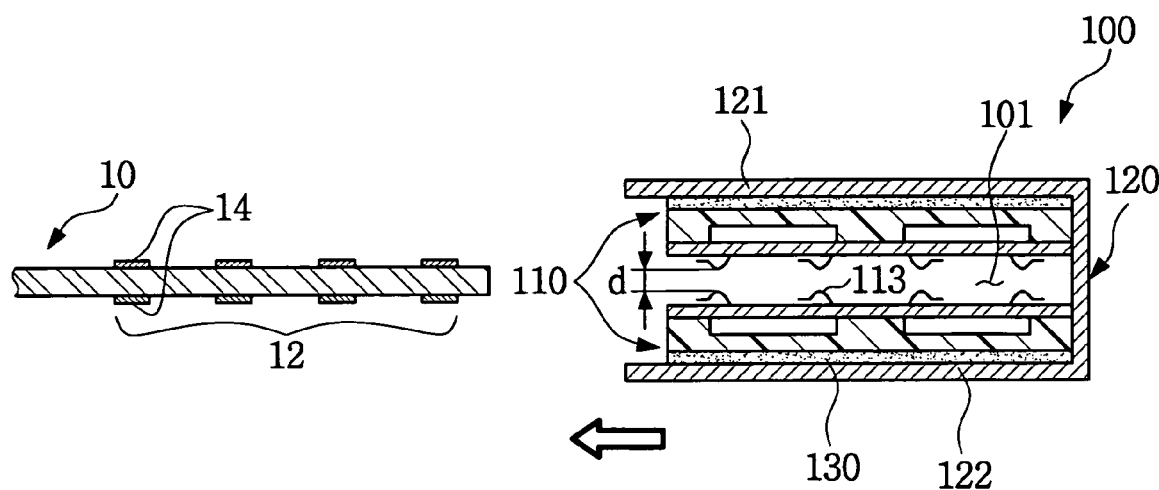
FIG. 2B is a cross-sectional view of the memory module shown in FIG. 2A, after assembly, and a motherboard.

FIG. 2B is a cross-sectional view of the memory module 100 after assembly and the motherboard 10.

Referring to FIG. 2B, the motherboard 10 may have the contact pads 14 along the peripheral region 12. The contact pads 14 may be arranged on both surfaces of the motherboard 10.

In the memory module 100, the unit packages 110 may be fixed to the upper plate 121 and the lower plate 122, respectively. The unit packages 110 may be spaced apart from each other to define a receiving space 101 into which the peripheral region 12 of the motherboard 10 is inserted. In this regard, the memory module 100 may provide a socket (or cavity) that serves as a receptacle for receiving a portion of the motherboard 10. The contact terminals 113 of the unit packages 110 may extend into the receiving space 101 (or socket). As shown, the contact terminal 113 of the upper unit package 110 may be superposed over the contact terminals 113 of the lower unit package 110. In alternative embodiments, the contact terminals 113 of the upper unit package 110 may be offset relative to the contact terminals 113 of the lower unit package 110.

Figure 2C:
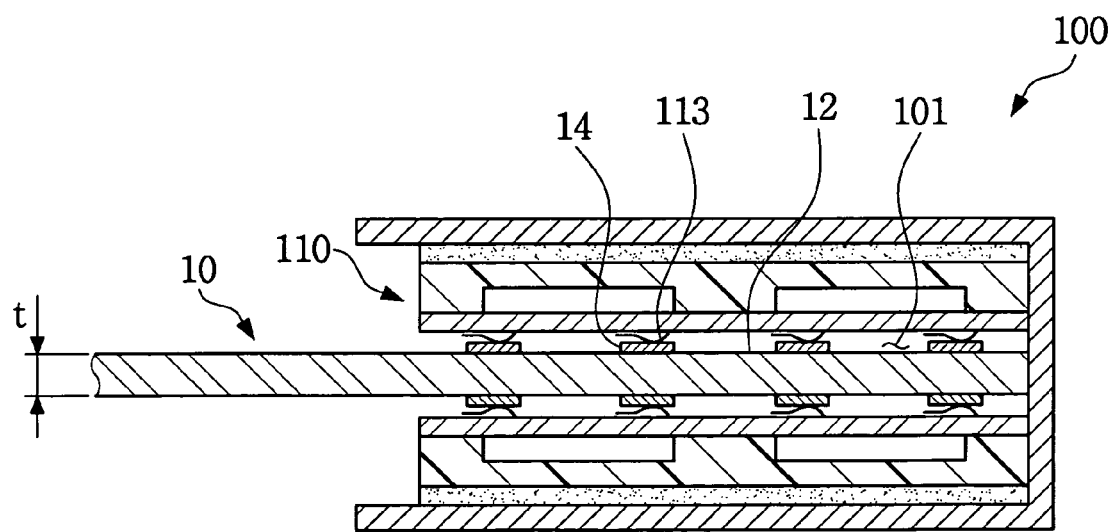
FIG. 2C is a cross-sectional view of a connection between the memory module and the motherboard shown in FIG. 2B.

FIG. 2C is a cross-sectional view of a connection between the memory module 100 and the motherboard 10.

As shown in FIG. 2C, the memory module 100 may be connected to the peripheral region 12 of the motherboard 10 by inserting the peripheral region 12 of the motherboard 10 into the receiving space 101 (or socket) of the memory module 100. Thus, the peripheral region 12 of the motherboard 10 may be located in the receiving space 101 (or socket) of the memory module 100. In this example embodiment, the memory module 100 may completely cover the inserted portion of the peripheral region 12 of the motherboard 10. In alternative embodiments, the memory module 100 may only partially cover the inserted portion of the peripheral region 12 of the motherboard 10. For example, the memory module 100 may have plates with openings (e.g., for cooling air) that may be in fluid communication with the receiving space 101 (or socket).

The contact terminals 113 of the memory module 100 may be in contact with and electrically coupled to the contact pads 14 of the motherboard 10. Before connection, the distance ('d' of FIG. 2B) between the confronting contact terminals 113 of the upper and the lower unit packages 110 may be smaller than the thickness ('t' of FIG. 2C) of the motherboard 10. As the peripheral portion 12 of the motherboard 10 is inserted into the receiving space 101 (or socket), the motherboard 10 and/or the contact pads 14 may press against and elastically bend the contact terminals 113. Accordingly, the contact pads 14 may be easily and reliably connected to the contact terminals 113 by insertion of the motherboard 10.

Figure 3A:
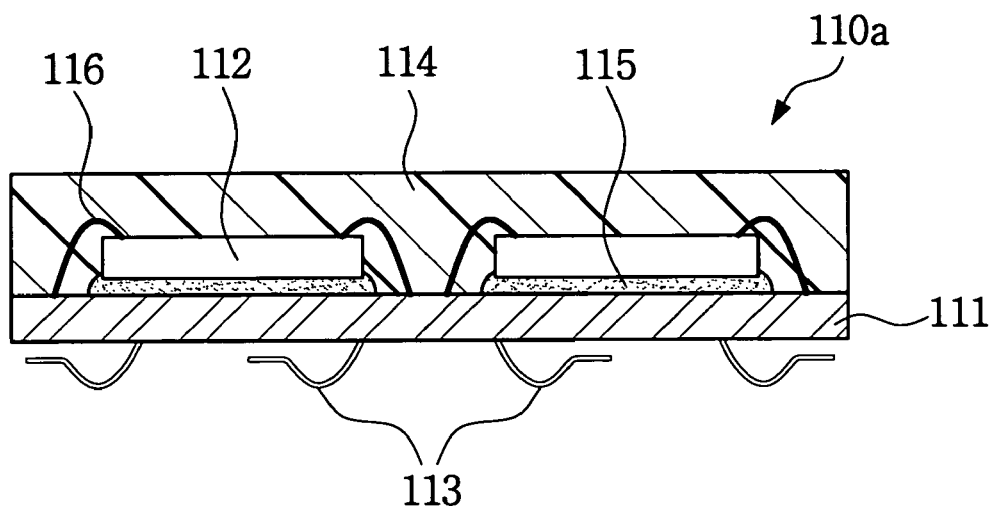
FIG. 3A is a cross-sectional view of an example, non-limiting embodiment of a unit package that may be implemented in the memory module shown in FIGS. 2A to 2C.

Example, non-limiting embodiments of unit packages, which may be suitably implemented in the memory module 100 of FIGS. 2A-2C, are described below. FIG. 3A is a cross-sectional view of an example unit package 110a, and FIG. 3B is a cross-sectional view of another example unit package 110b.

Figure 3B:
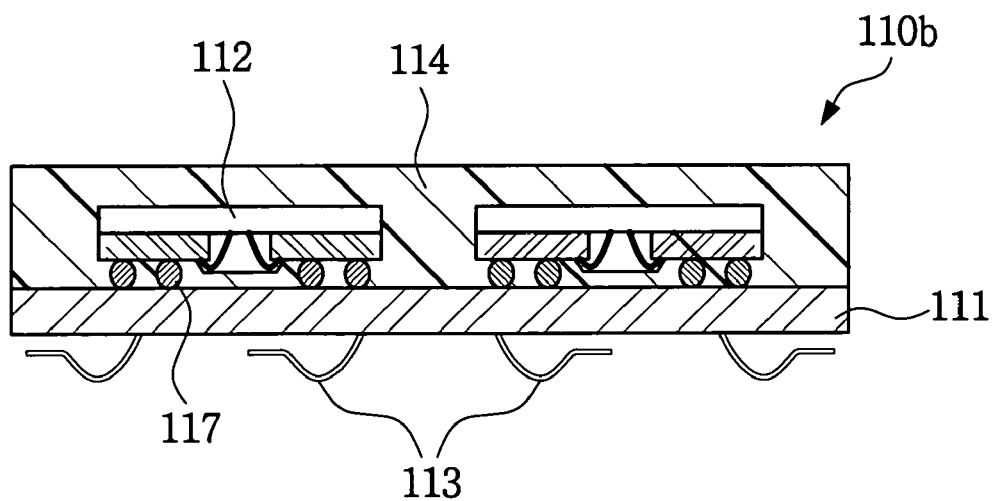
FIG. 3B is a cross-sectional view of another example, non-limiting embodiment of a unit package that may be implemented in the memory module shown in FIGS. 2A to 2C.

As shown in FIGS. 3A and 3B, each of the unit packages 110a and 110b may have a circuit substrate 111. At least one memory chip 112 may be mounted on a first surface of the circuit substrate 111. A plurality of the contact terminals 113 may be provided on a second surface of the circuit substrate 111. But there are some notable differences.

In the unit package 110a shown in FIG. 3A, the memory chip 112 may be in the form of a bare chip that may be mounted on the circuit substrate 111. The memory chip 112 may be mechanically joined to the circuit substrate 111 via an adhesive layer 115. The memory chip 112 may be electrically coupled to the circuit substrate 111 via bonding wires 116. In alternative embodiments, the memory chip 112 may be mechanically joined and electrically coupled to the circuit substrate 111 through conductive bumps (not shown) provided on the memory chip 112 using flip chip bonding techniques that are well known in this art.

In the unit package 110b shown in FIG. 3B, the memory chip 112 may be assembled in a sub-package including conductive bumps 117. The sub-package may be mechanically joined and electrically coupled to the circuit substrate 111 via the conductive bumps 117. In alternative embodiments, the memory chip 112 may be assembled in a sub-package including a lead frame (not shown).

Each of the unit packages 110a and 110b shown in FIGS. 3A and 3B may have a lateral configuration in which the memory chips 112 may be arranged in a side by side fashion. In alternative embodiments, each of the unit packages may have a vertical configuration in which the memory chips may be stacked in layers. Each of the unit packages 110a and 110b may have one or more memory chips 112.

Each of the unit packages 110a and 110b may have a package body 114 provided on the first surface of the circuit substrate 111. The package body 114 may be fabricated from a molding resin, for example, and may cover and/or protect the memory chips 112.

The contact terminals 113 of each of the unit packages 110a and 110b may be elongated metal leads that may extend from the circuit substrate 111. The contact terminals 113 may be shaped to extend laterally. By way of example only, the contact terminals may be bent to have a serpentine shape. Although not depicted, the respective contact terminals 113 may be electrically coupled to the circuit substrate 111 via internal circuitry (not shown) of the circuit substrate 111.

Figure 3C:
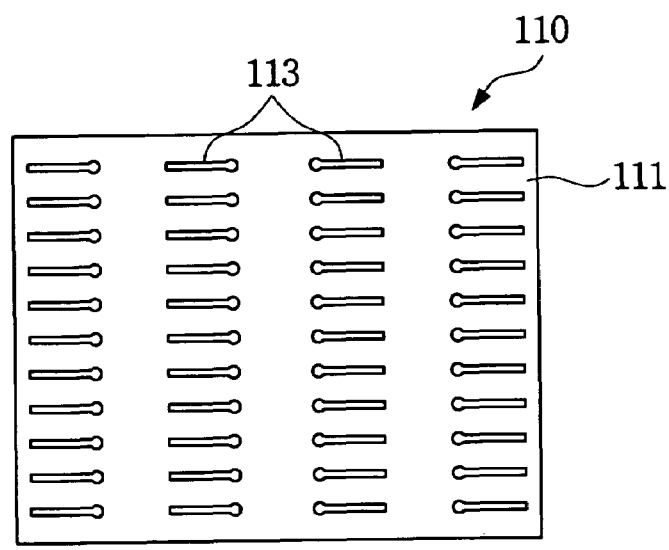
FIG. 3C is a plan view of an example configuration of contact terminals that may be implemented in the unit packages shown in FIGS. 3A and 3B.

FIG. 3C is a plan view of an example configuration of the contact terminals 113 that may be implemented in the unit packages 110a and 110b shown in FIGS. 3A and 3B, respectively. As shown in FIG. 3C, the contact terminals 113 may be arranged in a regular fashion on the second surface of the circuit substrate 111. In alternative embodiments, the contact terminals 113 may be arranged in an irregular fashion on the circuit substrate 111. The configuration of the contact terminals 113 may correspond to that of the contact pads (14 of FIG. 1) of the motherboard.

It will be appreciated that a given memory module 100 may include unit packages that may have similar structures. For example, a memory module may implement two unit packages 110a (as shown in FIG. 3A), or alternatively two unit packages 110b (as shown in FIG. 3B). In alternative embodiments, a given memory module 100 may include unit packages that may have dissimilar structures. For example, a memory module may implement a unit package 110a (as shown in FIG. 3A) and a unit package 110b (as shown in FIG. 3B). Furthermore, the memory modules 100 mounted on a given motherboard may implement similar or dissimilar unit packages.

Figure 4A:
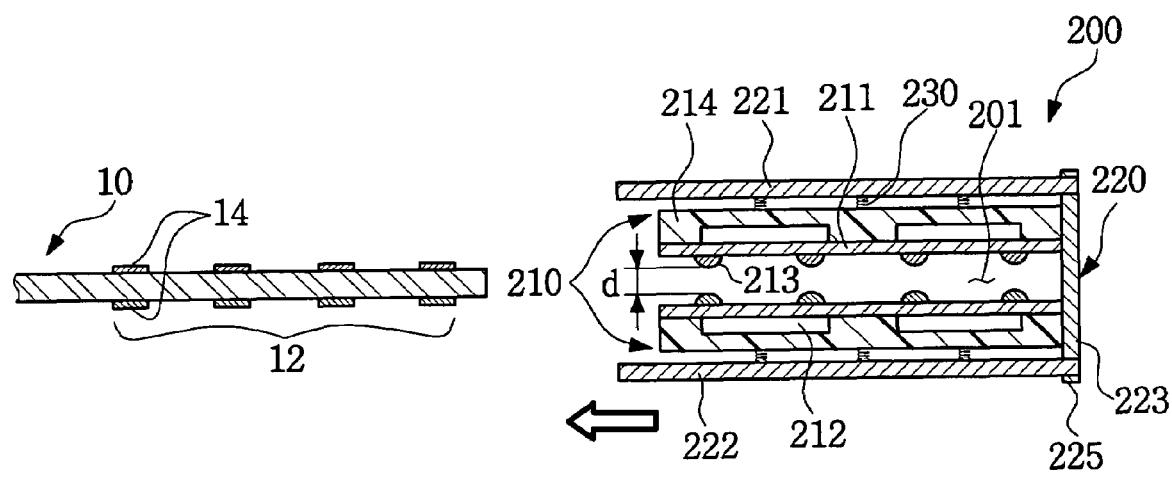
FIG. 4A is a cross-sectional view of a memory module and a motherboard in accordance with another example, non-limiting embodiment of the present invention.
Figure 4B:
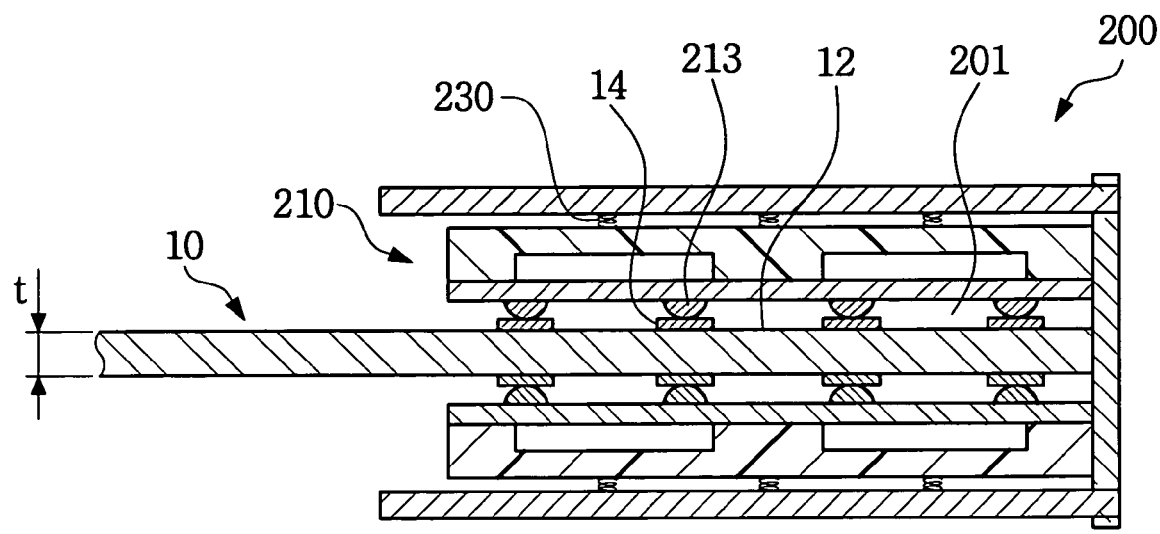
FIG. 4B is a cross-sectional view of a connection between the memory module and the motherboard shown in FIG. 4A.

FIG. 4A is a cross-sectional view of a memory module 200 and a motherboard 10 in accordance with another example, non-limiting embodiment of the present invention. FIG. 4B is a cross-sectional view of a connection between the memory module 200 and the motherboard 10 shown in FIG. 4A.

Referring to FIGS. 4A and 4B, the memory module 200 may include two unit packages 210 and a module frame 220.

Each unit package 210 may have a circuit substrate 211. At least one memory chip 212 may be mounted on a first surface of the circuit substrate 211. A plurality of contact terminals 213 may be provided on a second surface of the circuit substrate 211. The unit package 210 may have a package body 214 provided on the first surface of the circuit substrate 211 that may cover and/or protect the memory chip 212. Each contact terminal 213 may be a conductive bump, such as a solder bump, for example. The memory module 200 may include elastic members 230 interposed between the unit packages 210 and the module frame 200. The elastic members 230 may elastically support the unit packages 210.

The module frame 220 may include plates. In this example embodiment, the module frame 220 may include three plates: an upper plate 221 and a lower plate 222, which may be substantially parallel to and spaced apart from each other; and a side plate 223 connecting the upper and the lower plates 221 and 222 together. In alternative embodiments, the module frame 220 may include more or less than three plates. As shown, the plates 121, 122 and 123 may have a flat shape. In alternative embodiments, the plates may have numerous and alternative shapes that will be readily apparent to shoes skilled in the art.

The respective unit packages 210 may be movably mounted on the upper and the lower plates 221 and 222 through the elastic members 230. In this example embodiment, the elastic members 230 may in the form of coil springs. In alternative embodiments, the elastic members 230 may be in the form of elastomer layers, leaf springs, sponge materials, and/or other materials, which are well known in this art, and which may provide the desired elasticity characteristics. By way of example only, the respective unit packages 210 may be mounted on the upper and the lower plates 221 and 222, and then the side plate 223 may be fastened to the upper and the lower plates 221 and 222 through fastening members 225, such as screws (for example).

The unit packages 210 may be spaced apart from each other, defining a receiving space 201 (or socket) into which the peripheral region 12 of the motherboard 10 may be inserted. The contact terminals 213 of the unit packages 210 may face each other. In alternative embodiments, the contact terminals 213 of the upper unit package 210 may be offset relative to the contact terminals 213 of the lower unit package 210.

As shown in FIG. 4B, the memory module 200 may be connected to the peripheral region 12 of the motherboard 10 by inserting the peripheral region 12 of the motherboard 10 into the receiving space 201 (or socket) of the memory module 200. Thus, the peripheral region 12 of the motherboard 10 may be located in the receiving space 201 (or socket) of the memory module 200. As in the previous embodiment, the memory module 200 may (or may not) completely cover the inserted portion of the peripheral region 12 of the motherboard 10.

The contact terminals 213 of the memory module 200 may be in contact with and electrically coupled to the contact pads 14 of the motherboard 10. Before connection, the distance ('d' of FIG. 4A) between the confronting contact terminals 213 of the upper and the lower unit packages 210 may be smaller than the thickness ('t' of FIG. 4B) of the motherboard 10. As the peripheral portion 12 of the motherboard 10 is inserted into the receiving space 201 (or socket), the motherboard 10 and/or the contact pads 14 may press against the contact terminals 213 and drive the unit packages 210 outward, against the influence of the elastic members 230. Accordingly, the contact pads 14 may be easily and reliably connected to the contact terminals 213 by insertion of the motherboard 10.

The structure of the unit packages 210 may be similar to that of the previous embodiment, except for the contact terminals 213. Like the previous embodiment, the unit packages 210 of this embodiment may have a variety of structures. Further, a given memory module 200 may include unit packages that may have similar structures. In alternative embodiments, a given memory module 200 may include unit packages that may have dissimilar structures. The memory modules 200 mounted on a given motherboard may implement similar or dissimilar unit packages.

Figure 5:
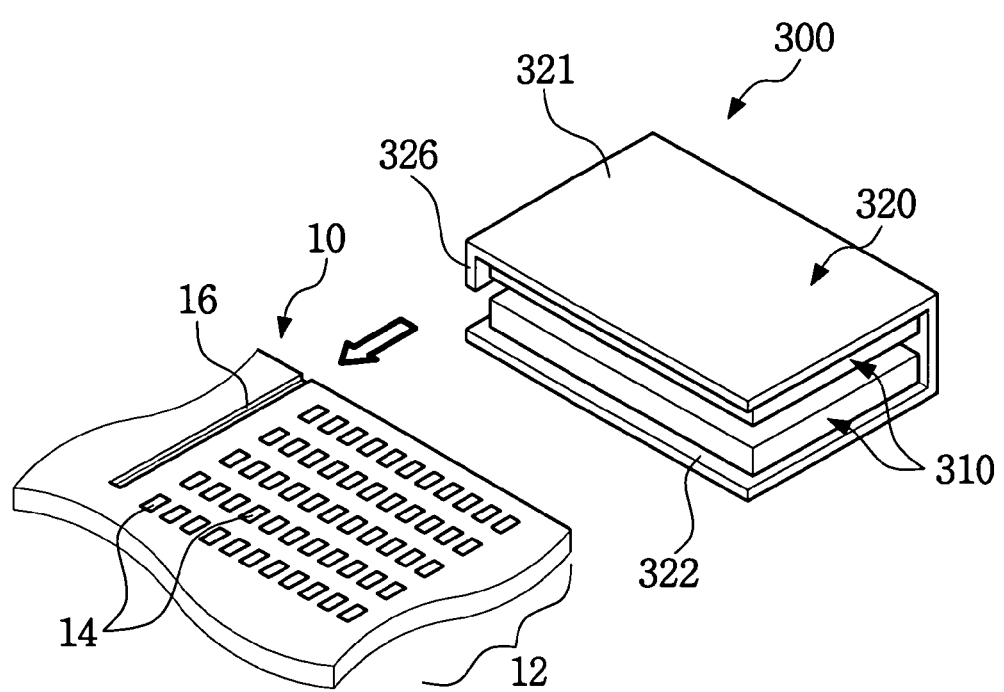
FIG. 5 is a partial perspective view of a memory module and a motherboard in accordance with another example, non-limiting embodiment of the present invention.

FIG. 5 is a partial perspective view of a memory module 300 and a motherboard 10 in accordance with another example, non-limiting embodiment of the present invention.

Referring to FIG. 5, the memory module 300 similar to those of the previous embodiments. In this example embodiment, however, the memory module 300 may include a guide projection 326. The guide projection 326 may protrude from an upper plate 321 toward a lower plate 322. In alternative embodiments, the guide projection 326 may be provided on the lower plate 322 or on both plates 321 and 322.

The motherboard 10 may have a guide groove 16, at the peripheral region 12. The guide groove 16 may correspond to the guide projection 326. The guide groove 16 may be provided in one or both surfaces of the motherboard 10. The guide projection 326 and the guide groove 16 may be of substantially equal length. The height of the guide projection 326 may be greater than the depth of the guide groove 16. When the memory module 300 is connected to the motherboard 10, the guide projection 326 may be inserted into the guide groove 16, such that the contact terminals (not shown) may align with corresponding contact pads 14. In alternative embodiments, the memory module 300 may include a guide groove that may cooperate with a guide projection provided on the motherboard.

In the disclosed embodiments, the motherboard may have contact pads on both major surfaces. In alternative embodiments, the contact pads may be provided only on a single surface of the motherboard. Similarly, the memory module may include only a single unit package. It will be appreciated that various features of the different embodiments may be implemented in a single memory module. For example, a given memory module may include a unit package having elastically bendable contact terminals 113 (as shown in FIGS. 2-3, for example), and at the same time, an elastic member 230 may be interposed between the unit package and a module frame of the memory module (as shown in FIG. 4, for example).

While example, non-limiting embodiments of the invention have been particularly shown and described, it will be understood by those skilled in the art that various changes in form and details may be made therein without departing from the spirit and scope of the invention as defined by the appended claims.

What is claimed is:

1. A connection interface comprising:
    a motherboard including an upper surface, a lower surface opposing the upper surface, and a plurality of first contact pads arranged along a peripheral region of the upper surface; and
    a memory module including
        a module frame having an upper plate facing the upper surface, a lower plate facing the lower surface, and a side plate, the upper and the lower plates being substantially parallel to and spaced apart from each other, the side plate connecting the upper and the lower plates together, the upper, the lower and the side plates defining an inner space of the module frame; and
    an upper unit package mounted on the upper plate and located in the inner space, the upper unit package having a plurality of first contact terminals, the upper unit package and the lower plate defining a receiving space in the inner space,
    the peripheral region of the motherboard being located in the receiving space, and the first contact terminals of the memory module contacting and electrically coupled to the first contact pads of the motherboard.

2. The connection interface of claim 1, wherein
    the motherboard further includes a plurality of second contact pads arranged along a peripheral region of the lower surface,
    the memory module further includes a lower unit package mounted on the lower plate and located in the inner space, and the lower unit package having a plurality of second contact terminals,
    the receiving space is defined by the upper and the lower unit packages, and the second contact terminals are in contact with and electrically coupled to the second contact pads.

3. The connection interface of claim 2, wherein the first and the second contact terminals are elongated metal leads that are elastically bendable toward the upper and the lower unit packages, respectively.

4. The connection interface of claim 2, wherein
    at least one of the upper and the lower plates has a guide projection protruding toward the other plate, and
    the motherboard further includes at least one guide groove formed on at least one of the upper and the lower surfaces.

5. The connection interface of claim 1, further comprising a fixing member fixing the upper unit package to the upper plate of the module frame.

* * * * *